US012617941B2

(12) United States Patent
Inokuchi

(10) Patent No.: US 12,617,941 B2
(45) Date of Patent: May 5, 2026

(54) HEAT-CURABLE RESIN COMPOSITION

(71) Applicant: Shin-Etsu Chemical Co., Ltd., Tokyo (JP)

(72) Inventor: Yoshinori Inokuchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 483 days.

(21) Appl. No.: 18/035,825

(22) PCT Filed: Nov. 19, 2021

(86) PCT No.: PCT/JP2021/042537
§ 371 (c)(1),
(2) Date: May 8, 2023

(87) PCT Pub. No.: WO2022/113892
PCT Pub. Date: Jun. 2, 2022

(65) Prior Publication Data
US 2023/0407082 A1 Dec. 21, 2023

(30) Foreign Application Priority Data
Nov. 27, 2020 (JP) ................................. 2020-196439

(51) Int. Cl.
| *C08L 63/00* | (2006.01) |
| *C08G 77/00* | (2006.01) |
| *C08G 77/04* | (2006.01) |
| *H05K 1/03* | (2006.01) |

(52) U.S. Cl.
CPC .............. *C08L 63/00* (2013.01); *C08G 77/04* (2013.01); *H05K 1/0353* (2013.01); *C08G 77/80* (2013.01); *C08L 2205/18* (2013.01); *H05K 2201/0257* (2013.01)

(58) Field of Classification Search
CPC ................................. C08L 63/00; C08G 77/04
See application file for complete search history.

(56) References Cited

U.S. PATENT DOCUMENTS

| 4,560,716 | A | 12/1985 | Sato et al. |
| 2014/0288245 | A1 | 9/2014 | Swier et al. |
| 2021/0179785 | A1 | 6/2021 | Knoer et al. |
| 2022/0000756 | A1 | 1/2022 | Inokuchi et al. |

FOREIGN PATENT DOCUMENTS

| JP | 61-160955 A | 7/1986 |
| JP | 2003-335860 A | 11/2003 |
| JP | 2010-237479 A | 10/2010 |
| JP | 2013-104029 A | 5/2013 |
| JP | 2014-532787 A | 12/2014 |
| JP | 2016-69516 A | 5/2016 |
| JP | 2020-75881 A | 5/2020 |
| JP | 2020-523425 A | 8/2020 |
| KR | 10-0882533 B1 | 2/2009 |
| WO | WO 2013/066965 A1 | 5/2013 |
| WO | WO 2017/135045 A1 | 8/2017 |
| WO | WO 2019/086094 A1 | 5/2019 |
| WO | WO 2020/095757 A1 | 5/2020 |

OTHER PUBLICATIONS

Machine translation of JP2003335860 (Year: 2003).*
Machine translation of JP2016069516 (Year: 2016).*
International Search Report for PCT/JP2021/042537 (PCT/ISA/210) mailed on Jan. 25, 2022.
Written Opinion of the International Searching Authority for PCT/JP2021/042537 (PCT/ISA/237) mailed on Jan. 25, 2022.
Chinese Office Action and Search Report for Chinese Application No. 202180079281.2, dated Jun. 12, 2025, with English translation.
Akopova et al., "A Thermoanalytical Study of Curing of Epoxy-Amine Binders Modified with Epoxy-Containing Silsesquioxane," Polymer Science, Series D. Glues and Sealing Materials, vol. 8, No. 2, 2015, pp. 133-137.
Extended European Search Report for European Application No. 21897866.6, dated Nov. 19, 2025.
Mishra et al., "Enhancing the mechanical properties of an epoxy resin using polyhedral oligomeric silsesquioxane (POSS) as nano-reinforcement," Polymer Testing, vol. 62, 2017, pp. 210-218.

* cited by examiner

*Primary Examiner* — Wenwen Cai
(74) *Attorney, Agent, or Firm* — Birch, Stewart, Kolasch & Birch, LLP

(57) ABSTRACT

Provided is a heat-curable resin composition capable of lowering the elastic modulus of a cured product obtained even when a heat-curable resin component in the composition contains an organic solvent or has a high curing temperature. The heat-curable resin composition contains:
(A) a heat-curable resin; and
(B) spherical polymethylphenyl silsesquioxane particles that have a volume average particle size of 0.1 to 30 μm, and are in an amount of 1 to 35 parts by mass per 100 parts by mass of the component (A),
wherein a molar ratio between units represented by $CH_3SiO_{3/2}$ and units represented by $C_6H_5SiO_{3/2}$ ($CH_3SiO_{3/2}$ units:$C_6H_5SiO_{3/2}$ units) in the polymethylphenyl silsesquioxane particles is 95:5 to 55:45.

9 Claims, No Drawings

HEAT-CURABLE RESIN COMPOSITION

TECHNICAL FIELD

The present invention relates to a heat-curable resin composition, particularly to a heat-curable resin composition that is suitable for use in a packaging agent for an electronic or electric part and in a printed-wiring board.

BACKGROUND ART

In recent years, electronic devices such as cell phones, smartphones, ultrathin liquid crystal TVs and light-weight laptop computers are becoming smaller. In this regard, the electronic parts used in these devices are now, for example, integrated and packaged at higher densities. Further, a resin material used in these electronic parts is required to possess a lower elastic modulus so that breakage shall not occur due to a stress caused by thermal expansion of the electronic parts. Also, in the case of a printed-wiring board used in mobile devices, it is required that the resin material be one having a low elastic modulus so that breakage shall not occur due to a dropping impact.

It has been disclosed that by adding silicone rubber particles to an epoxy resin composition, the elastic modulus of a cured product of such composition can be lowered, and the stress thereof can thus be lowered as well (Patent document 1). However, if a heat-curable resin component therein contains an organic solvent, there is a problem that an unfavorable moldability will be observed as the silicone rubber particles shall swell due to the organic solvent. Further, it is not feasible when the curing temperature of the heat-curable resin component is higher than the decomposition temperature of the silicone rubber particles.

Meanwhile, there is disclosed an epoxy resin composition containing polyorganosilsesquioxane particles whose structural formula is expressed as $RSiO_{3/2}$ (R is an organic substituent group) (Patent document 2). The polymethyl silsesquioxane particles exemplified in Patent document 2 and whose structural formula is expressed as $CH_3SiO_{3/2}$ do not swell due to an organic solvent and have a decomposition temperature higher than that of silicone rubber particles; however, such polymethyl silsesquioxane particles have a low performance for reducing the stress of a resin. The polyphenyl silsesquioxane particles exemplified in Patent document 2 and whose structural formula is expressed as $C_6H_5SiO_{3/2}$ have a decomposition temperature higher than that of silicone rubber particles, but are soluble in an organic solvent. The polymethylphenyl silsesquioxane particles that are exemplified in Patent document 2 and are composed of units represented by $CH_3SiO_{3/2}$ and units represented by $C_6H_5SiO_{3/2}$ with a molar ratio between the $CH_3SiO_{3/2}$ and $C_6H_5SiO_{3/2}$ units being 1:1, do not swell due to an organic solvent, have a decomposition temperature higher than that of silicone rubber particles, and exhibit a performance for reducing the stress of a resin. However, due to a high agglomeration property thereof, such particles have, for example, a problem that they will adhere to the wall of a production device by a large amount; and a problem that they have a poor dispersibility in a resin.

PRIOR ART DOCUMENTS

Patent Documents

Patent document 1: JP-A-2013-104029
Patent document 2: JP-A-Sho 61-160955

SUMMARY OF THE INVENTION

Problems to be Solved by the Invention

Thus, it is an object of the present invention to provide a heat-curable resin composition capable of lowering the elastic modulus of a cured product obtained even when a heat-curable resin component in the composition contains an organic solvent or has a high curing temperature.

Means to Solve the Problems

The inventor of the present invention diligently conducted a series of studies to achieve the above object, and completed the invention as follows. That is, the inventor found that the heat-curable resin composition shown below was able to achieve the above object when using particular polymethylphenyl silsesquioxane particles having a low agglomeration property.

[1]
A heat-curable resin composition comprising:
(A) a heat-curable resin; and
(B) spherical polymethylphenyl silsesquioxane particles that have a volume average particle size of 0.1 to 30 μm, and are in an amount of 1 to 35 parts by mass per 100 parts by mass of the component (A),
wherein a molar ratio between units represented by $CH_3SiO_{3/2}$ and units represented by $C_6H_5SiO_{3/2}$ ($CH_3SiO_{3/2}$ units:$C_6H_5SiO_{3/2}$ units) in the polymethylphenyl silsesquioxane particles is 95:5 to 55:45.

[2]
The heat-curable resin composition according to [1], comprising:
(A) the heat-curable resin; and
(B) the spherical polymethylphenyl silsesquioxane particles that have the volume average particle size of 0.1 to 30 μm, and are in the amount of 1 to 35 parts by mass per 100 parts by mass of the component (A),
wherein the polymethylphenyl silsesquioxane particles are composed of the units represented by $CH_3SiO_{3/2}$ and the units represented by $C_6H_5SiO_{3/2}$, and the molar ratio between the $CH_3SiO_{3/2}$ units and the $C_6H_5SiO_{3/2}$ units ($CH_3SiO_{3/2}$ units:$C_6H_5SiO_{3/2}$ units) is 95:5 to 55:45.

[3]
The heat-curable resin composition according to [1] or [2], wherein the spherical polymethylphenyl silsesquioxane particles as the component (B) have a thermal decomposition temperature of not lower than 400° C. when measured by a thermogravimetric measurement device under an air atmosphere and at a temperature rising rate of 10° C./min.

[4]
The heat-curable resin composition according to any one of [1] to [3], wherein the heat-curable resin as the component (A) is at least one selected from an epoxy resin, a phenolic resin, a cyanate resin and a maleimide resin.

[5]
A cured product of the heat-curable resin composition according to any one of [1] to [4].

Effects of the Invention

Since the heat-curable resin composition of the present invention is capable of lowering the elastic modulus of the cured product obtained even when the heat-curable resin is one containing an organic solvent or having a high curing temperature, the composition is suitable for use in a packaging agent for an electronic or electric part and in a printed-wiring board.

MODE FOR CARRYING OUT THE INVENTION

The present invention is described in detail hereunder.
[Component (A)]

A component (A) is a heat-curable resin. There are no particular restrictions on such heat-curable resin so long as it is one used as a packaging agent for an electronic or electric part, or as a printed-wiring board; examples of this heat-curable resin include an epoxy resin, a phenolic resin, a cyanate resin and a maleimide resin. Any one kind of these resins may be used alone, or two or more kinds of them may be used in combination.

Although not particularly limited, examples of the epoxy resin include a bisphenol-type epoxy resin such as a bisphenol A-type epoxy resin, a bisphenol F-type epoxy resin, a bisphenol E-type epoxy resin, a bisphenol S-type epoxy resin, a bisphenol Z-type epoxy resin (4,4'-cyclohexadiene bisphenol-type epoxy resin), a bisphenol P-type epoxy resin (4,4'-(1,4-phenylenediisoprediene)bisphenol-type epoxy resin), and a bisphenol M-type epoxy resin (4,4'-(1,3-phenylenediisoprediene)bisphenol-type epoxy resin); a novolac-type epoxy resin such as a phenol novolac-type epoxy resin and a cresol novolac-type epoxy resin; a naphthalene-type epoxy resin such as a naphthalene skeleton-modified epoxy resin, a methoxynaphthalene-modified cresol novolac-type epoxy resin, and a methoxynaphthalene dimethylene-type epoxy resin; a biphenyl-type epoxy resin; a xylylene-type epoxy resin; a phenol aralkyl-type epoxy resin; a biphenyl aralkyl-type epoxy resin; a biphenyl dimethylene-type epoxy resin; an aryl alkylene-type epoxy resin such as a trisphenol methane novolac-type epoxy resin; an anthracene-type epoxy resin; a phenoxy-type epoxy resin; a dicyclopentadiene-type epoxy resin; a norbornene-type epoxy resin; an adamantane-type epoxy resin; a fluorene-type epoxy resin; and a flame-retarded epoxy resin obtained by halogenating any of these epoxy resins. Any one kind of these epoxy resins may be used alone, or two or more kinds of them may be used in combination; or one or more kinds of them and a prepolymer(s) thereof may be used in combination.

Although not particularly limited, examples of the phenolic resin include a phenol novolac resin, an alkylphenol novolac resin, a bisphenol A novolac resin, a dicyclopentadiene-type phenolic resin, a xylok-type phenolic resin, a terpene-modified phenolic resin, and polyvinyl phenols. Any one kind of these phenolic resins may be used alone, or two or more kinds of them may be used in combination; or one or more kinds of them and a prepolymer(s) thereof may be used in combination.

Although not particularly limited, examples of the cyanate resin include a novolac-type cyanate resin; a bisphenol-type cyanate resin such as a bisphenol A-type cyanate resin, a bisphenol E-type cyanate resin, and a tetramethyl bisphenol F-type cyanate resin; and a naphthol aralkyl-type cyanate resin. Any one kind of these cyanate resins may be used alone, or two or more kinds of them may be used in combination; or one or more kinds of them and a prepolymer(s) thereof may be used in combination.

Although not particularly limited, examples of the maleimide resin include bismaleimide resins such as N,N'-(4,4'-diphenylmethane)bismaleimide, bis(3-ethyl-5-methyl-4-maleimidephenyl)methane, and 2,2-bis[4-(4-maleimidephenoxy)phenyl]propane. Any one kind of these maleimide resins may be used alone, or two or more kinds of them may be used in combination; or one or more kinds of them and a prepolymer(s) thereof may be used in combination. Further, there may also be used in combination one or more kinds of maleimide resins other than those listed above.
[Component (B)]

A component (B) are spherical polymethylphenyl silsesquioxane particles having a volume average particle size of 0.1 to 30 μm. This volume average particle size is preferably 0.5 to 10 μm, more preferably 1 to 5 μm. When such volume average particle size is smaller than 0.1 μm, a high agglomeration property will be incurred, which makes it difficult to produce and handle the particles, and uniformly disperse the particles in a composition. When such volume average particle size is larger than 30 μm, there will be achieved a lower performance for reducing the stress of a cured product of the composition.

Here, in this specification, the volume average particle size (MV value) refers to a value measured by an electrical resistivity method. Further, in this specification, the expression "spherical" refers not only to a condition where the particles have a true spherical shape, but also to a condition where the particles have a substantially spherical shape. For example, this means that the particles may also include those having a deformed oval shape whose ratio of major axis length/minor axis length (aspect ratio) is on average normally 1 to 4, preferably 1 to 2, more preferably 1 to 1.6, even more preferably 1 to 1.4. The shape of the particles can be confirmed by observing the particles with an optical microscope or an electron microscope. Moreover, as to a dispersibility in terms of particle size, the particles may be monodispersed or polydispersed.

A molar ratio between units represented by $CH_3SiO_{3/2}$ and units represented by $C_6H_5SiO_{3/2}$ ($CH_3SiO_{3/2}$ units: $C_6H_5SiO_{3/2}$ units) in the spherical polymethylphenyl silsesquioxane particles as the component (B) is 95:5 to 55:45, more preferably 80:20 to 60:40. Further, it is preferred that the spherical polymethylphenyl silsesquioxane particles as the component (B) are those composed of the units represented by $CH_3SiO_{3/2}$ and the units represented by $C_6H_5SiO_{3/2}$. When the $CH_3SiO_{3/2}$ units in the component (B) are in an amount of larger than 95 mol %, there will be achieved a poor performance for reducing the stress of the cured product of the composition. When the $C_6H_5SiO_{3/2}$ units in the component (B) are in an amount of larger than 45 mol %, the particles will exhibit a high agglomeration property, which makes it difficult to produce and handle the particles, and uniformly disperse the particles in a composition. Further, when the $C_6H_5SiO_{3/2}$ units in the component (B) are in an amount of larger than 50 mol %, part of or all the particles will be dissolved in an organic solvent such as acetone, which makes them unusable in an organic solvent-containing composition.

Within a scope which does not impair the properties of the particles, such as the non-agglomeration property and dispersibility thereof, the component (B) may contain one or more kinds of siloxane units selected from a $R^1{}_2SiO_{2/2}$ unit, $R^1{}_3SiO_{1/2}$ unit, $SiO_{4/2}$ unit and $R^2SiO_{3/2}$ unit. The one or more kinds of units selected from the $R^1{}_2SiO_{2/2}$ unit, $R^1{}_3SiO_{1/2}$ unit, $SiO_{4/2}$ unit and $R^2SiO_{3/2}$ unit are preferably contained in the component (B) by an amount of 0 to 20%, more preferably 0 to 10%, even more preferably 0 to 5%.

$R^1$ in the above formulae represents a monovalent organic group having 1 to 20 carbon atoms. Examples of $R^1$ include an alkyl group such as a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an eicosyl group; a cycloalkyl group such as a cyclobutyl group, a cyclopentyl group, a cyclohexyl group, and a cycloheptyl group; an aryl group such as a phenyl group, a tolyl group, and a naphthyl group; an aralkyl group such as a benzyl group, a phenethyl group, and a 3-phenyl-propyl group; an alkenyl group such as a vinyl group and an allyl group; and hydrocarbon groups obtained by substituting part of or all the hydrogen atoms bonded to the carbon atoms in any of these groups with atoms such as halogen atoms (fluorine atom, chlorine atom, bromine atom, iodine atom) and/or substituent groups such as an acryloyloxy group, a methacryloyloxy group, an epoxy group, a glycidoxy group, an amino group, a mercapto group, and a carboxyl group.

$R^2$ in the above formulae represents a monovalent organic group having 1 to 20 carbon atoms, other than a methyl group and a phenyl group. Examples of $R^2$ may include those exemplified as $R^1$, excluding a methyl group and a phenyl group.

It is preferred that the component (B) have a high thermal decomposition temperature. This is because when such thermal decomposition temperature is high, the component (B) is useable even when the component (A) has a high curing temperature. Specifically, the thermal decomposition temperature of the component (B) is preferably not lower than 400° C., more preferably not lower than 450° C., when measured by a thermogravimetric measurement device under an air atmosphere and at a temperature rising rate of 10° C./min.

The component (B) can be produced by a known method. For example, at first, one or more kinds of a methyltrialkoxysilane represented by a general formula $CH_3Si(OR^3)_3$ ($R^3$ in the formula represents an unsubstituted monovalent hydrocarbon group having 1 to 6 carbon atoms) and one or more kinds of a phenyltrialkoxysilane represented by a general formula $C_6H_5Si(OR^3)_3$ ($R^3$ in the formula represents an unsubstituted monovalent hydrocarbon group having 1 to 6 carbon atoms) are added to an alkaline aqueous solution to cause hydrolyzation and condensation reaction so as to obtain an aqueous dispersion of the particles.

Alternatively, one or more kinds of the methyltrialkoxysilane represented by the general formula $CH_3Si(OR^3)_3$ ($R^3$ in the formula represents an unsubstituted monovalent hydrocarbon group having 1 to 6 carbon atoms) and one or more kinds of the phenyltrialkoxysilane represented by the general formula $C_6H_5Si(OR^3)_3$ ($R^3$ in the formula represents an unsubstituted monovalent hydrocarbon group having 1 to 6 carbon atoms) are added to an acidic aqueous solution to cause hydrolyzation, followed by adding an alkaline substance thereto to cause condensation reaction so as to obtain an aqueous dispersion of the particles.

Next, water and by-product alcohols are removed from the aqueous dispersion thus obtained via, for example, heating and drying.

As a result, there can be obtained spherical polymethylphenyl silsesquioxane particles.

If the particles obtained are agglomerated, a crusher may be used to crush them.

$R^3$ in the above formulae represents an unsubstituted monovalent hydrocarbon group having 1 to 6 carbon atoms. Examples of $R^3$ include a methyl group, an ethyl group, a propyl group, a butyl group, a pentyl group, and a hexyl group. Particularly, a methyl group is preferred.

As for the steps of obtaining the aqueous dispersion of the particles, in terms of a capability of producing the particles without generating a gel-like substance, of the two aforementioned methods, preferred is the method where the methyltrialkoxysilane and phenyltrialkoxysilane are added to an aqueous solution of an acidic substance to cause hydrolyzation, followed by adding an alkaline substance thereto to cause condensation reaction.

Specifically, more preferred is a method including the following steps (i) to (iv).

Step (i)

A step of obtaining a transparent aqueous solution via a hydrolyzation reaction caused by adding methyltrimethoxysilane to a water having a pH of 4.0 to 7.0.

Step (ii)

A step of obtaining a transparent silane aqueous solution via a hydrolyzation reaction caused by adding phenyltrimethoxysilane to the transparent aqueous solution obtained in the step (i).

Step (iii)

A step of obtaining a mixed solution by adjusting the temperature of the transparent silane aqueous solution obtained in the step (ii) to 0 to 15° C., and then adding thereto an alkaline substance or an aqueous solution with an alkaline substance dissolved therein before performing stirring and mixing.

Step (iv)

A step of precipitating polymethylphenyl silsesquioxane particles by allowing the mixed solution obtained in the step (iii) to stand still.

It is preferred that the method be one where a total amount of methyltrimethoxysilane and phenyltrimethoxysilane is 5 to 30 parts by mass per 100 parts by mass of water in the steps (i) and (ii).

In the case of the heat-curable resin composition of the present invention, the component (B) is contained in an amount of 1 to 35 parts by mass, preferably 2 to 25 parts by mass, more preferably 3 to 20 parts by mass, per 100 parts by mass of the component (A). When the component (B) is contained in an amount of smaller than 1 part by mass per 100 parts by mass of the component (A), there will be achieved a lower performance for reducing the stress of the cured product of the composition; when the component (B) is contained in an amount of larger than 35 parts by mass per 100 parts by mass of the component (A), the strength of the cured product will deteriorate.

Optional Components

If necessary, and within a scope which does not impair the effects of the present invention, the heat-curable resin composition of the present invention may further contain components other than the components (A) and (B). For example, there may be listed a curing agent (e.g. 4,4'-diamino-3,3'-dimethyldiphenylmethane), an inorganic filler (e.g. silica, glass fiber), a synthetic fiber, a curing accelerator (e.g. imidazoles, triphenylphosphine, and quaternary phosphonium salt), a polymerization initiator, a mold release agent, a flame retardant, an ion-trapping agent, an antioxidant, an adhesion-imparting agent, a stress-lowering agent, a colorant, a coupling agent, and an organic solvent.

Here, a total amount of the components (A) and (B) in the heat-curable resin composition of the present invention is preferably 5 to 100% by mass, more preferably 10 to 100% by mass, even more preferably 20 to 100% by mass.

Production Method

The heat-curable resin composition of the present invention can be obtained by stirring, melting, mixing and dispersing the components (A) and (B) as well as the optional component(s) while performing a heating treatment if necessary. There are no particular restrictions on a device for performing these mixing, stirring, dispersion and so on; there may be used, for example, a planetary mixer, a triple roll mill, a ball mill, a bead mill, or a grinding machine. Further, these devices may be appropriately used with one another in combination. The heat-curable resin composition obtained may be used as a molding material.

Molding Method

The heat-curable resin composition of the present invention can be molded by a known molding method. As such molding method, there may be employed, for example, a transfer molding method or a compression molding method.

In a transfer molding method, a transfer molding machine is used, where at a molding pressure of 5 to 20 N/mm², molding is carried out at a molding temperature of 120 to 190° C. for a molding time of 30 to 500 sec, preferably at a molding temperature of 150 to 185° C. for a molding time of 30 to 300 sec.

Further, in a compression molding method, a compression molding machine is used, where molding is carried out at a molding temperature of 120 to 190° C. for a molding time of 30 to 900 sec, preferably at a molding temperature of 130 to 160° C. for a molding time of 120 to 600 sec.

Furthermore, in either molding method, post curing may be performed at 150 to 225° C. for 0.5 to 20 hours.

WORKING EXAMPLES

The present invention is described in detail hereunder with reference to working and comparative examples; however, the present invention shall not be limited to the working examples shown below.

Described hereunder are methods for measuring a dissolution amount in acetone and a thermal decomposition temperature in production examples.

[Measurement of Dissolution Amount in Acetone]

Here, 5 g of a sample and 15 g of acetone are weighed into a 25 mL glass bottle, whereby an acetone suspension is prepared by mixing the sample and the acetone which is three times the amount of the sample. After putting a lid on such glass bottle, the acetone suspension is then shaken for 30 min. This acetone suspension is then filtrated with a filter paper, followed by weighing about 2 g of the filtrate into an aluminum petri dish, and then drying the same with a dryer at 105° C. The weight of the dried residue is then measured, whereby a dissolution amount of the sample in acetone (%) is then calculated from the weight of the filtrate and the weight of the dried residue. At that time, since the sample is extracted by the acetone which is three times the amount of the sample, the dissolution amount in acetone (%) is calculated by tripling the amount of the dried residue.

[Measurement of Thermal Decomposition Temperature]

Using a thermogravimetric measurement device, measurement is conducted under an air atmosphere and at a temperature rising rate of 10° C./min, whereby a thermal decomposition temperature is determined based on changes in a weight reduction rate.

Production Example 1

Here, 801 g of an ion-exchange water were put into a 1 L glass flask, and the temperature of the water was adjusted to 20° C. The pH of the ion-exchange water was confirmed to be 5.9 by measurement. An anchor-shaped stirring blade was used to perform stirring at a blade rotation rate of 150 rpm, and as a result of putting 95.5 g of methyltrimethoxysilane into the glass flask, heat generation occurred such that the temperature rose to 24° C. A transparent state was achieved after 3 min, and stirring was then performed for another 7 min. Next, 62.5 g of phenyltrimethoxysilane was put into the glass flask, and as a result of keeping performing stirring while maintaining the temperature at 20 to 25° C., a transparent state was achieved after 50 min, after which stirring was performed for another 5 min. It then took 25 min to cool the solution to 5° C. Further, a mixed solution of 0.53 g of a 28% by mass ammonia aqueous solution and 2.65 g of an ion-exchange water was put into the glass flask, followed by performing stirring for 30 sec before stopping stirring. White turbidity occurred 12 sec after stirring was stopped.

After being left to stand still for 3 hours, stirring was started at the blade rotation rate of 150 rpm. The solution was heated to 75° C., and 38 g of the 28% by mass ammonia aqueous solution was added to the glass flask, where stirring was further performed at 73 to 77° C. for an hour. After cooling the solution to 30° C. or lower, a pressure filtration device was used to perform deliquoring so as to obtain a cake-like product; this cake-like product was then dried at 105° C. in a hot-air circulating dryer to obtain a dried product.

With regard to such dried product obtained, the dissolution amount thereof in acetone was measured by the above method, and it was confirmed that its dissolution amount in acetone was 0%.

A jet mill was used to crush the dried product obtained, thereby obtaining polymethylphenyl silsesquioxane particles.

The polymethylphenyl silsesquioxane particles obtained were such that a molar ratio between the methyl silsesquioxane units and the phenyl silsesquioxane units was calculated to be 69:31 based on the amounts of methyltrimethoxysilane and phenyltrimethoxysilane as raw materials.

As a result of observing the shape(s) of these polymethylphenyl silsesquioxane particles with an electron microscope, it was confirmed that these particles each had a spherical shape whose aspect ratio was 1. As a result of measuring the volume average particle size of these polymethylphenyl silsesquioxane particles with an electrical-resistivity-method particle size distribution measurement device "Multisizer 3" (by Beckman Coulter, Inc.), it was confirmed that the volume average particle size was 2.1 μm. As a result of measuring the thermal decomposition temperature by the above method, it was confirmed that the thermal decomposition temperature of the particles was about 500° C.

Production Example 2

Here, 815 g of an ion-exchange water were put into a 1 L glass flask, and the temperature of the water was adjusted to 20° C. The pH of the ion-exchange water was confirmed to be 5.9 by measurement. An anchor-shaped stirring blade was used to perform stirring at a blade rotation rate of 150 rpm, and as a result of putting 77.6 g of methyltrimethoxysilane into the glass flask, heat generation occurred such that the temperature rose to 24° C. A transparent state was achieved after 3 min, and stirring was then performed for another 7 min. Next, 66.4 g of phenyltrimethoxysilane was put into the glass flask, and as a result of keeping performing stirring while maintaining the temperature at 20 to 25° C., a transparent state was achieved after 55 min, after which stirring was performed for another 5 min. It then took 25 min to cool the solution to 5° C. Further, a mixed solution of 0.54 g of a 28% by mass ammonia aqueous solution and 2.7 g of an ion-exchange water was put into the glass flask, followed by performing stirring for 20 sec before stopping stirring. White turbidity occurred 12 sec after stirring was stopped.

After being left to stand still for 3 hours, stirring was started at the blade rotation rate of 150 rpm. The solution was heated to 75° C., and 38 g of the 28% by mass ammonia aqueous solution was added to the glass flask, where stirring was further performed at 73 to 77° C. for an hour. After cooling the solution to 30° C. or lower, a pressure filtration device was used to perform deliquoring so as to obtain a cake-like product; this cake-like product was then dried at 105° C. in a hot-air circulating dryer to obtain a dried product.

With regard to such dried product obtained, the dissolution amount thereof in acetone was measured by the above method, and it was confirmed that its dissolution amount in acetone was 0%.

A jet mill was used to crush the dried product obtained, thereby obtaining polymethylphenyl silsesquioxane particles.

The polymethylphenyl silsesquioxane particles obtained were such that a molar ratio between the methyl silsesquioxane units and the phenyl silsesquioxane units was calculated to be 63:37 based on the amounts of methyltrimethoxysilane and phenyltrimethoxysilane as raw materials.

As a result of observing the shape(s) of these polymethylphenyl silsesquioxane particles with an electron microscope, it was confirmed that these particles each had a spherical shape whose aspect ratio was 1. As a result of measuring the volume average particle size of these polymethylphenyl silsesquioxane particles with an electrical-resistivity-method particle size distribution measurement device "Multisizer 3" (by Beckman Coulter, Inc.), it was confirmed that the volume average particle size was 2.1 μm. As a result of measuring the thermal decomposition temperature by the above method, it was confirmed that the thermal decomposition temperature of the particles was about 510° C.

Production Example 3

Here, 789 g of an ion-exchange water were put into a 1 L glass flask, and the temperature of the water was adjusted to 20° C. The pH of the ion-exchange water was confirmed to be 5.8 by measurement. An anchor-shaped stirring blade was used to perform stirring at a blade rotation rate of 150 rpm, and as a result of putting 110.5 g of methyltrimethoxysilane into the glass flask, heat generation occurred such that the temperature rose to 24° C. A transparent state was achieved after 4 min, and stirring was then performed for another 6 min. Next, 59.5 g of phenyltrimethoxysilane was put into the glass flask, and as a result of keeping performing stirring while maintaining the temperature at 20 to 25° C., a transparent state was achieved after 45 min, after which stirring was performed for another 5 min. It then took 25 min to cool the solution to 5° C. Further, a mixed solution of 0.52 g of a 28% by mass ammonia aqueous solution and 2.6 g of an ion-exchange water was put into the glass flask, followed by performing stirring for 30 sec before stopping stirring. White turbidity occurred 30 sec after stirring was stopped.

After being left to stand still for 3 hours, stirring was started at the blade rotation rate of 150 rpm. The solution was heated to 75° C., and 38 g of the 28% by mass ammonia aqueous solution was added to the glass flask, where stirring was further performed at 73 to 77° C. for an hour. After cooling the solution to 30° C. or lower, a pressure filtration device was used to perform deliquoring so as to obtain a cake-like product; this cake-like product was then dried at 105° C. in a hot-air circulating dryer to obtain a dried product.

With regard to such dried product obtained, the dissolution amount thereof in acetone was measured by the above method, and it was confirmed that its dissolution amount in acetone was 0%.

A jet mill was used to crush the dried product obtained, thereby obtaining polymethylphenyl silsesquioxane particles.

The polymethylphenyl silsesquioxane particles obtained were such that a molar ratio between the methyl silsesquioxane units and the phenyl silsesquioxane units was calculated to be 73:27 based on the amounts of methyltrimethoxysilane and phenyltrimethoxysilane as raw materials.

As a result of observing the shape(s) of these polymethylphenyl silsesquioxane particles with an electron microscope, it was confirmed that these particles each had a spherical shape whose aspect ratio was 1. As a result of measuring the volume average particle size of these polymethylphenyl silsesquioxane particles with an electrical-resistivity-method particle size distribution measurement device "Multisizer 3" (by Beckman Coulter, Inc.), it was confirmed that the volume average particle size was 2.2 μm. As a result of measuring the thermal decomposition temperature by the above method, it was confirmed that the thermal decomposition temperature of the particles was about 490° C.

Production Example 4

Here, 772 g of an ion-exchange water were put into a 1 L glass flask, and the temperature of the water was adjusted to 20° C. The pH of the ion-exchange water was confirmed to be 5.9 by measurement. An anchor-shaped stirring blade was used to perform stirring at a blade rotation rate of 150 rpm, and as a result of putting 113.1 g of methyltrimethoxysilane into the glass flask, heat generation occurred such that the temperature rose to 25° C. A transparent state was achieved after 3 min, and stirring was then performed for another 7 min. Next, 73.9 g of phenyltrimethoxysilane was put into the glass flask, and as a result of keeping performing stirring while maintaining the temperature at 20 to 25° C., a transparent state was achieved after 45 min, after which stirring was performed for another 5 min. It then took 25 min to cool the solution to 5° C. Further, a mixed solution of 0.53 g of a 28% by mass ammonia aqueous solution and 2.65 g of an ion-exchange water was put into the glass flask, followed by performing stirring for 30 sec before stopping stirring. White turbidity occurred 12 sec after stirring was stopped.

After being left to stand still for 3 hours, stirring was started at the blade rotation rate of 150 rpm. The solution was heated to 75° C., and 38 g of the 28% by mass ammonia aqueous solution was added to the glass flask, where stirring was further performed at 73 to 77° C. for an hour. After cooling the solution to 30° C. or lower, a pressure filtration device was used to perform deliquoring so as to obtain a cake-like product; this cake-like product was then dried at 105° C. in a hot-air circulating dryer to obtain a dried product.

With regard to such dried product obtained, the dissolution amount thereof in acetone was measured by the above method, and it was confirmed that its dissolution amount in acetone was 0%.

A jet mill was used to crush the dried product obtained, thereby obtaining polymethylphenyl silsesquioxane particles.

The polymethylphenyl silsesquioxane particles obtained were such that a molar ratio between the methyl silsesquioxane units and the phenyl silsesquioxane units was calculated to be 69:31 based on the amounts of methyltrimethoxysilane and phenyltrimethoxysilane as raw materials.

As a result of observing the shape(s) of these polymethylphenyl silsesquioxane particles with an electron microscope, it was confirmed that these particles each had a spherical shape whose aspect ratio was 1. As a result of measuring the volume average particle size of these polymethylphenyl silsesquioxane particles with an electrical-resistivity-method particle size distribution measurement device "Multisizer 3" (by Beckman Coulter, Inc.), it was confirmed that the volume average particle size was 3.6 μm. As a result of measuring the thermal decomposition temperature by the above method, it was confirmed that the thermal decomposition temperature of the particles was about 500° C.

Production Example 5

Comparative Product

Here, 824 g of an ion-exchange water were put into a 1 L glass flask, and the temperature of the water was adjusted to 20° C. The pH of the ion-exchange water was confirmed to be 5.9 by measurement. An anchor-shaped stirring blade was used to perform stirring at a blade rotation rate of 150 rpm, and as a result of putting 133 g of methyltrimethoxysilane into the glass flask, heat generation occurred such that the temperature rose to 24° C. A transparent state was achieved after 3 min, and stirring was then performed for another 90 min while maintaining the temperature at 24° C. Next, a mixed solution of 1.0 g of a 28% by mass ammonia aqueous solution and 5.0 g of an ion-exchange water was put into the glass flask, followed by performing stirring for 30 sec before stopping stirring. White turbidity occurred 110 sec after stirring was stopped.

After being left to stand still for an hour, stirring was started at the blade rotation rate of 150 rpm. The solution was heated to 75° C., and 37 g of the 28% by mass ammonia aqueous solution was further added to the glass flask, where stirring was further performed at 73 to 77° C. for an hour. After cooling the solution to 30° C. or lower, a pressure filtration device was used to perform deliquoring so as to obtain a cake-like product; this cake-like product was then dried at 105° C. in a hot-air circulating dryer to obtain a dried product.

With regard to such dried product obtained, the dissolution amount thereof in acetone was measured by the above method, and it was confirmed that its dissolution amount in acetone was 0%.

A jet mill was used to crush the dried product obtained, thereby obtaining polymethyl silsesquioxane particles only composed of methyl silsesquioxane units.

As a result of observing the shape(s) of these polymethyl silsesquioxane particles with an electron microscope, it was confirmed that these particles each had a spherical shape whose aspect ratio was 1. As a result of measuring the volume average particle size of these polymethyl silsesquioxane particles with an electrical-resistivity-method particle size distribution measurement device "Multisizer 3" (by Beckman Coulter, Inc.), it was confirmed that the volume average particle size was 2.1 μm. As a result of measuring the thermal decomposition temperature by the above method, it was confirmed that the thermal decomposition temperature of the particles was about 430° C.

Production Example 6

Comparative Product

Here, 810 g of an ion-exchange water were put into a 1 L glass flask, and the temperature of the water was adjusted to 20° C. The pH of the ion-exchange water was confirmed to be 5.9 by measurement. An anchor-shaped stirring blade was used to perform stirring at a blade rotation rate of 150 rpm, and as a result of putting 60.7 g of methyltrimethoxysilane into the glass flask, heat generation occurred such that the temperature rose to 25° C. A transparent state was achieved after 2 min, and stirring was then performed for another 8 min. Next, 88.3 g of phenyltrimethoxysilane was put into the glass flask, and as a result of keeping performing stirring while maintaining the temperature at 20 to 25° C., a transparent state was achieved after 45 min, after which stirring was performed for another 5 min. It then took 25 min to cool the solution to 5° C. Further, a mixed solution of 0.53 g of a 28% by mass ammonia aqueous solution and 2.65 g of an ion-exchange water was put into the glass flask, followed by performing stirring for 30 sec before stopping stirring. White turbidity occurred 5 sec after stirring was stopped.

After being left to stand still for 3 hours, stirring was started at the blade rotation rate of 150 rpm. The solution was heated to 75° C., and 38 g of the 28% by mass ammonia aqueous solution was added to the glass flask, where stirring was further performed at 73 to 77° C. for an hour. After cooling the solution to 30° C. or lower, a pressure filtration device was used to perform deliquoring so as to obtain a cake-like product; this cake-like product was then dried at 105° C. in a hot-air circulating dryer to obtain a dried product.

With regard to such dried product obtained, the dissolution amount thereof in acetone was measured by the above method, and it was confirmed that its dissolution amount in acetone was 0%.

A jet mill was used to crush the dried product obtained; however, due to a high agglomeration property of the particles, the crushing process was not easy. Further, since a large amount of the dried product had adhered to the inner wall of the device, only a small amount of polymethylphenyl silsesquioxane particles were able to be collected; the particles were thus not subjected to evaluation as the following comparative example(s).

The polymethylphenyl silsesquioxane particles obtained were such that a molar ratio between the methyl silsesquioxane units and the phenyl silsesquioxane units was calculated to be 50:50 based on the amounts of methyltrimethoxysilane and phenyltrimethoxysilane as raw materials.

Production Example 7

Comparative Product

Here, 801 g of an ion-exchange water and 19 g of a 28% by mass ammonia aqueous solution were put into a 1 L glass flask, and the temperature of the solution prepared was adjusted to 20° C. The pH of the ammonia aqueous solution was confirmed to be 11.4 by measurement. An anchor-shaped stirring blade was used to perform stirring at a blade rotation rate of 150 rpm, where 3 hours were spent delivering 180 g of phenyltrimethoxysilane by drops into the glass flask, during which the temperature was maintained at 20 to 22° C. White turbidity occurred about 20 min after phenyltrimethoxysilane had been delivered by drops.

After finishing delivering phenyltrimethoxysilane by drops, and after maintaining the temperature at 20 to 22° C., stirring was further performed at 73 to 77° C. for an hour. After cooling the solution to 30° C. or lower, a pressure filtration device was used to perform deliquoring so as to obtain a cake-like product; this cake-like product was then dried at 105° C. in a hot-air circulating dryer to obtain a dried product.

A jet mill was used to crush the dried product obtained. However, due to an extremely high agglomeration property of the particles, the crushing process was not easy, and only a small amount of polyphenyl silsesquioxane particles were able to be collected; the particles were thus not subjected to evaluation as the following comparative example(s).

Further, the dried product obtained was polyphenyl silsesquioxane only composed of phenyl silsesquioxane units; as a result of measuring the dissolution amount thereof in acetone by the above method, it was confirmed that its dissolution amount in acetone was 100%. Thus, it was clear that these particles were unusable in an organic solvent-containing composition.

Working Examples 1 to 6; Comparative Examples 1 to 2

The components were weighed at the composition amounts (grams) shown in Table 1, and were stirred by a planetary mixer for 15 min under a reduced pressure, thereby obtaining a heat-curable resin composition. This resin composition was then poured into a mold, and treated at 150° C. for 4 hours so as to be cured, thus obtaining a molded product (cured product) having a width of 10 mm, a length of 100 mm, and a thickness of 5 mm.

The molded product obtained was handled as a test piece, where a bending elastic modulus and bending strength thereof were measured by a method described in JIS K 7171:2016. The results are shown in Table 1.

1 where the component (B) was not used, and the comparative example 2 where there were used the polymethyl silsesquioxane particles which were not the component (B).

As is clear from the above results, even when the heat-curable resin (component (A)) contains an organic solvent, or the curing temperature thereof is high, by using the particular polymethylphenyl silsesquioxane particles (component (B)), the elastic modulus of the cured product of the composition containing the components (A) and (B) can be lowered. Thus, the heat-curable resin composition of the present invention is suitable for use in a packaging agent for an electronic or electric part, and in a printed-wiring board.

The invention claimed is:

1. A heat-curable resin composition comprising:
(A) a heat-curable resin; and
(B) spherical polymethylphenyl silsesquioxane particles that have a volume average particle size of 0.1 to 30 μm, and are in an amount of 1 to 35 parts by mass per 100 parts by mass of the component (A),
wherein a molar ratio between units represented by $CH_3SiO_{3/2}$ and units represented by $C_6H_5SiO_{3/2}$ ($CH_3SiO_{3/2}$ units:$C_6H_5SiO_{3/2}$ units) in the polymethylphenyl silsesquioxane particles is 95:5 to 55:45,
the heat-curable resin as the component (A) is at least one selected from an epoxy resin, a phenolic resin, a cyanate resin and a maleimide resin, and
the component (B) causes a cured product of the heat-curable resin composition to lower the elastic modulus of the cured product.

2. The heat-curable resin composition according to claim 1,

TABLE 1

| Composition amount (g) | Working example 1 | Working example 2 | Working example 3 | Working example 4 | Working example 5 | Working example 6 | Comparative example 1 | Comparative example 2 |
|---|---|---|---|---|---|---|---|---|
| ZX-1059 (Epoxy resin) ※1 | 100 | 100 | 100 | 100 | 100 | 100 | 100 | 100 |
| KAYAHARD A-A (Curing agent) ※2 | 38.9 | 38.9 | 38.9 | 38.9 | 38.9 | 38.9 | 38.9 | 38.9 |
| Polymethylphenyl silsesquioxane particles of production example 1 | 11.1 | | | | 5.6 | 16.7 | | |
| Polymethylphenyl silsesquioxane particles of production example 2 | | 11.1 | | | | | | |
| Polymethylphenyl silsesquioxane particles of production example 3 | | | 11.1 | | | | | |
| Polymethylphenyl silsesquioxane particles of production example 4 | | | | 11.1 | | | | |
| Polymethyl silsesquioxane particles of production example 5 | | | | | | | | 11.1 |
| Bending elastic modulus N/mm² | 2699 | 2656 | 2737 | 2758 | 2848 | 2549 | 3034 | 3096 |
| Bending strength N/mm² | 78 | 75 | 83 | 79 | 83 | 71 | 107 | 100 |

※1 ZX-1059: by NIPPON STEEL Chemical & Material Co., Ltd.
※2 KAYAHARD A-A: by Nippon Kayaku Co., Ltd.

In each case of the polymethylphenyl silsesquioxane particles as the component (B) which were used in the working examples 1 to 6, and the polymethyl silsesquioxane particles which were not the component (B) but were used in the comparative example 2, the particles uniformly dispersed in the composition without agglomerating.

Further, lower elastic moduli were observed in the working examples 1 to 6 as compared to the comparative example wherein the component (B) consists of the units represented by $CH_3SiO_{3/2}$ and the units represented by $C_6H_5SiO_{3/2}$.

3. The heat-curable resin composition according to claim 1, wherein the spherical polymethylphenyl silsesquioxane particles as the component (B) have a thermal decomposition temperature of not lower than 400° C. when measured by a thermogravimetric measurement device under an air atmosphere and at a temperature rising rate of 10° C./min.

4. A cured product of the heat-curable resin composition according to claim 1.

5. A method for lowering an elastic modulus of a cured product, comprising curing the heat-curable resin composition according to claim 1, and thereby lowering the elastic modulus of the cured product by the component (B).

6. A cured product of the heat-curable resin composition according to claim 2.

7. A method for lowering an elastic modulus of a cured product, comprising curing the heat-curable resin composition according to claim 2, and thereby lowering the elastic modulus of the cured product by the component (B).

8. A cured product of the heat-curable resin composition according to claim 3.

9. A method for lowering an elastic modulus of a cured product, comprising curing the heat-curable resin composition according to claim 3, and thereby lowering the elastic modulus of the cured product by the component (B).

* * * * *